(12) United States Patent
Denes

(10) Patent No.: US 11,258,004 B2
(45) Date of Patent: Feb. 22, 2022

(54) TRANSDUCER DEVICE

(71) Applicant: Robert Bosch GmbH, Stuttgart (DE)

(72) Inventor: Istvan Denes, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 472 days.

(21) Appl. No.: 16/325,308

(22) PCT Filed: Aug. 10, 2017

(86) PCT No.: PCT/EP2017/070266
§ 371 (c)(1),
(2) Date: Feb. 13, 2019

(87) PCT Pub. No.: WO2018/041580
PCT Pub. Date: Mar. 8, 2018

(65) Prior Publication Data
US 2019/0207078 A1 Jul. 4, 2019

(30) Foreign Application Priority Data
Aug. 31, 2016 (DE) .......................... 102016216365.5

(51) Int. Cl.
*H01L 41/09* (2006.01)
*H01L 41/45* (2013.01)
*H01L 41/113* (2006.01)
*H01L 41/193* (2006.01)

(52) U.S. Cl.
CPC ...... *H01L 41/1132* (2013.01); *H01L 41/0986* (2013.01); *H01L 41/193* (2013.01); *H01L 41/45* (2013.01)

(58) Field of Classification Search
CPC ... H01L 41/45; H01L 41/193; H01L 41/0986; H01L 41/1132
See application file for complete search history.

(56) References Cited

U.S. PATENT DOCUMENTS

| 5,654,693 A | 8/1997 | Cocita |
| 6,198,206 B1 * | 3/2001 | Saarmaa ............... B06B 1/0644 310/340 |

(Continued)

FOREIGN PATENT DOCUMENTS

| DE | 102013216599 A1 | 2/2015 |
| EP | 2463926 A2 | 6/2012 |
| WO | 2012129357 A2 | 9/2012 |

OTHER PUBLICATIONS

International Search Report for PCT/EP2017/07070266, dated Nov. 3, 2017.

*Primary Examiner* — Shawki S Ismail
*Assistant Examiner* — Monica Mata
(74) *Attorney, Agent, or Firm* — Norton Rose Fulbright US LLP; Gerard Messina

(57) ABSTRACT

A transducer device, including an electroactive polymer transducer, which has at least two electrode layers which are situated in parallel to one another and which are connected to one another by inserting an elastic intermediate layer in each case, and including a circuit having electronic components for the purpose of generating an electrical voltage applied to the electrode layers of the polymer transducer, the circuit increasing an input voltage to a voltage which is increased with regard to the input voltage.

8 Claims, 3 Drawing Sheets

(56) References Cited

U.S. PATENT DOCUMENTS

| | | | |
|---|---|---|---|
| 2004/0217671 A1* | 11/2004 | Rosenthal | A61M 5/142 |
| | | | 310/328 |
| 2006/0181478 A1 | 8/2006 | Benato | |
| 2009/0161239 A1 | 6/2009 | Verhaar et al. | |
| 2012/0055257 A1 | 3/2012 | Shaw-Klein | |
| 2012/0170129 A1 | 7/2012 | Balian | |
| 2014/0247231 A1 | 9/2014 | Lin | |

\* cited by examiner

TRANSDUCER DEVICE

FIELD OF THE INVENTION

The present invention relates to a transducer device.

BACKGROUND INFORMATION

A transducer device of this type for use in a motor vehicle is discussed in DE 10 2013 216 599 A1 of the applicant. The transducer device includes an electroactive polymer element (polymer transducer) which is connectable to a voltage source. The voltage source includes, even though it is not explicitly disclosed in the publication, an electronic circuit which is configured to transform the (12 V) system voltage of the motor vehicle on the output side into a voltage of more than 50 V applied to the polymer transducer, since a voltage of this type is necessary to reasonably operate the polymer transducer or to be able to generate relatively large strokes. It is essential in this case that the polymer transducer and the electronic circuit are configured as individual units which are connected to one another. The problem here is that voltage sources which have more than 50 V nominal voltage, for example, are potentially dangerous for a human when touched by same. Therefore, special safety measures are necessary in order to avoid direct (human) contact with the voltage source. Moreover, circuits having high voltages of this type may cause field-related interferences in the surroundings, thus having an effect on the operation of the motor vehicle, so that additional measures, which further increase the effort related to device configuration, must be taken for the purpose of electromagnetic compatibility (EMC) of the transducer device.

SUMMARY OF THE INVENTION

The transducer device having the features described herein has the advantage that it is noncritical with regard to a potential endangerment resulting from the output voltage of the electronic circuit in that a direct contact with the voltage supply of the polymer transducer is excluded by design.

The main aspect underlying the present invention is to configure the electronic circuit for supplying the polymer transducer with voltage together with the polymer transducer in the form of a combined unit in which the contact points of the electronic circuit to or at the electrode layers of the polymer transducer are electrically insulated and the components of the electronic circuit are accommodated at least partially between several, electrically insulating layers and may be covered by the layers. A configuration of this type of the transducer device allows for the contact points or components, which guide voltage and are critical in the case of direct contact with a person, to be situated in an electrically insulated manner, so that a corresponding contact with a person is not possible.

It is essential within the scope of the present invention that the design or the configuration of the individual electrode layers of the polymer transducer, be it in the form of a diaphragm element or in the form of a stack actuator, is independent from the basic idea of the present invention and is implementable in general in all conceivable configurations or embodiments of the electrode layers.

The further descriptions herein describe advantageous refinements of the transducer device according to the present invention.

In a first constructive embodiment of the transducer device, it is provided that a carrier element is used to fasten the polymer transducer, the carrier element including several layers between which the components of the electronic circuit are accommodated at least partially in the form of a sandwich, and the carrier element being used at the same time to electrically contact the electrode layers or to surround the contacts. Since in this case, the contact takes place within the carrier element or between the individual, electrically insulating layers of the carrier element, an insulated installation of the polymer transducer at the carrier element is possible in a particularly easy manner.

The layers of the carrier element, which may be made of a suitable plastic, such as polyamide, polycarbonate, or from a polyester-based plastic, typically each have a layer thickness of approximately a few tenths of a millimeter, so that all in all, the carrier element may be flexibly configured depending on the number and thickness of the individual layers and their materials. This in particular allows for a particularly simple attachment or installation of the transducer device at (or in) an assembly unit or the like.

Furthermore, the first concrete constructive embodiment of the polymer transducer provides in a refinement that the polymer transducer includes a circular diaphragm whose central area is subjected to a weight element which has the effect that the circular area of the diaphragm is situated at an angle to the carrier element and is simultaneously oriented to be in parallel to the carrier element. When the polymer transducer is acted upon, the diaphragm expands, for example, as a result in such a way that the distance of the central area from the carrier element increases, the distance increase corresponding to the armature stroke of the transducer element.

In one alternatively provided embodiment of the transducer device in which the polymer transducer is configured in the form of a stack transducer, the polymer transducer includes a plurality of electrode layers, which are situated in parallel to one another, the outermost electrode layers of the electrode stack being covered in each case on the sides facing away from one another by an end cap, which is configured in each case as a force transmission element, and at least one of the end caps including several layers for accommodating the electronic circuit. It may thus be provided that the one end cap accommodates the electronic circuit and is simultaneously connected in a stationary manner to a carrier structure or the like, while the other end cap is connected to the element to be adjusted.

Independently of the concrete constructive embodiment of the polymer transducer, it may be provided that the components or units of the electronic circuit are accommodated at least partially in a layer containing recesses for the components of the electronic circuit which is covered by other layers from both sides. This, in particular, makes it possible to achieve a particularly protected installation or a particularly protected configuration of the components in the layer having the recesses, it being possible for the superimposition and connection of the individual layers to take place simultaneously with the aid of a laminating process.

Components may be provided in the electronic circuit whose thickness is so great that they cannot be situated in the layer accommodating the components without the layer thickness of same layer being increased to an undesirable extent. In this case, a refinement of the present invention provides that at least one component of the electronic circuit is situated at an outer side of an outer layer and is connected thereto and that the component is at least partially enclosed by an electrically insulating compound. This type of encapsulation of the outer component, which is configured from a resin, an elastomer, or a similar material, makes it possible to keep the number or overall thickness of the layers low, the (outer) electronic component still being situated in such a way that it is protected from environmental influences and from direct contact.

Depending on the installation location or constructive embodiment of the polymer transducer and of the electronic circuit, it may moreover be advantageous if the components of the electronic circuit are partially covered by a metallic layer for the purpose of generating an electromagnetic shielding device.

Further advantages, features, and details of the present invention are derived from the following description of the exemplary embodiments and the drawings.

Identical elements or elements having identical functions are provided with identical reference numerals in the figures.

DETAILED DESCRIPTION

Figure 1:
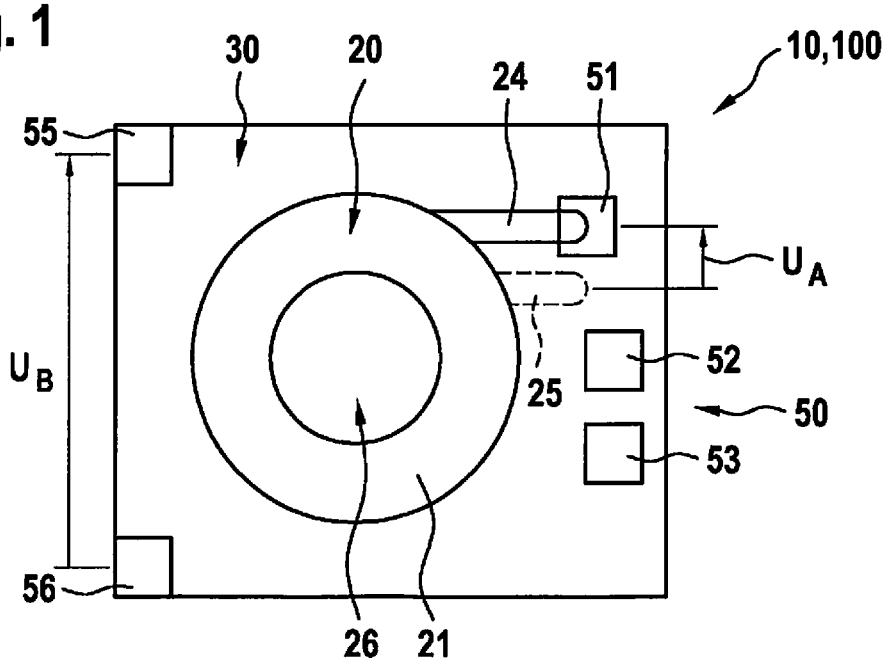
FIG. 1 shows a simplified bottom view of a transducer device including a carrier element having a rectangular base area.
Figure 2:
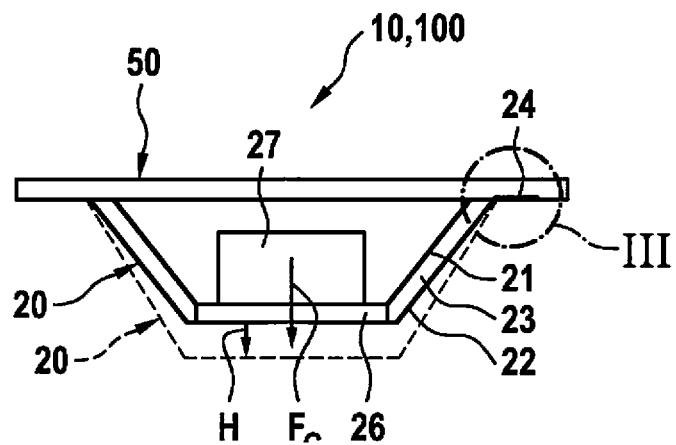
FIG. 2 shows a side view of the converter device according to FIG. 1.
Figure 3:
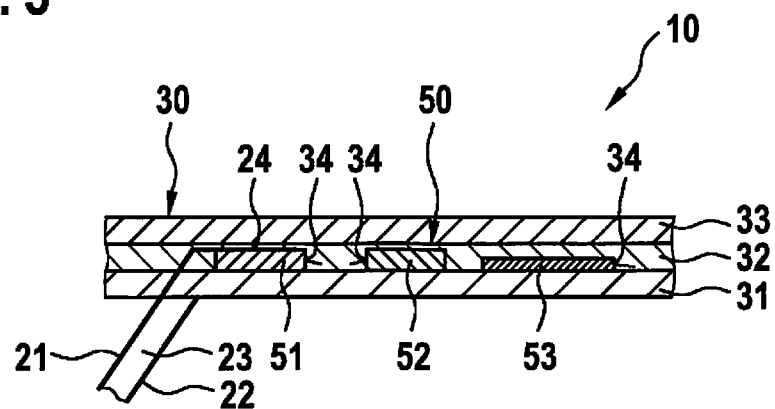
FIG. 3 shows a detail of FIG. 2 in an enlarged illustration.

FIGS. 1 through 3 show a simplified illustration of transducer device 10. Transducer device 10 includes an electroactive polymer transducer 20 and an electronic circuit 50 which is used to supply voltage to and control polymer transducer 20 and which together form a combined unit 100.

Polymer transducer 20 includes at least two flexible electrode layers 21, 22 which are connectable to the different poles of electronic circuit 50 and between which an elastic intermediate layer 23 is situated which is configured in the form of a dielectric. Polymer transducer 20 has a diaphragm configuration overall. The two electrode layers 21, 22 each have connection areas 24, 25 connected thereto, which are connected to the different poles of a voltage source configured through electronic circuit 50. From the top view, the two electrode layers 21, 22 each have an approximately circular configuration just as intermediate layer 23, the two electrode layers 21, 22 as well as intermediate layer 23 are situated flush to one another and run in parallel to one another. A central, planar area 26 of polymer transducer 20 is subjected to the force of a weight element 27, whose weight force $F_G$ acts perpendicularly to central area 26. On the side facing away from central area 26, the edge areas of polymer transducer 20 situated on the peripheral side are connected to a carrier element 30. Electrode layers 21, 22 and intermediate layer 23 run at an oblique angle to carrier element 30.

Carrier element 30 includes, for example, as is apparent in particular based on FIG. 3, three (flexible) layers 31 to 33 made of plastic which are connected to one another, situated on top of one another in the form of a sandwich, and which may be connected to one another through a laminating process. (Central) layer 32 which is situated between the two layers 31, 33 moreover has indentations, recesses 34 or the like for accommodating electronic components 51 through 53 which are integral parts of electronic circuit 50 or form same.

Components 51 through 53 may have different sizes and/or thicknesses or surface areas, it being essential, however, that components 51 through 53 are each situated within a recess 34. For example, the one component 51 is used to electrically connect to the one connection area 24; of course, it is also possible that instead of a component 51, an electrically conductive connection area is provided which is connected to circuit 50 For this purpose, corresponding through-holes (not illustrated) are configured for connection areas 24, 25 at least in the one layer 31. Output voltage $U_A$, generated by circuit 50, for controlling polymer transducer 20 is applied at the two connection areas 24, 25 of polymer transducer 20, output voltage $U_A$ being in particular more than 50 V.

At the corner areas, carrier element 30 furthermore includes by way of example two connection elements 55, 56 which are connected (not illustrated) to electronic circuit 50 and at which a voltage supply is applicable, in particular in the form of a system voltage $U_B$ of a motor vehicle. Here, the nominal voltage of system voltage $U_B$ is 12 V, for example. Electronic circuit 50 thus acts in the form of a transformer for increasing the voltage.

When polymer transducer 20 is energized by electronic circuit 50, an attractional force is generated between the two electrode layers 21, 22, so that their distance to one another is reduced. This results in that electrode layers 21, 22 expand together with intermediate layer 23 due to the volume consistency in the direction which runs perpendicularly to their particular layer. This, in turn, results in that central area 26 of polymer transducer 20 is deflected correspondingly to the dashed illustration in FIG. 2 by an armature stroke H in a direction which runs perpendicularly to carrier element 30 in order to adjust an element or the like, for example.

It is essential that connection areas 24, 25 of electrode layers 21, 22 as well as the elements of circuit 50 at which output voltage $U_A$ for electrode layers 21, 22 is applied, are situated in an electrically insulated manner with regard to the surroundings.

Figure 4:
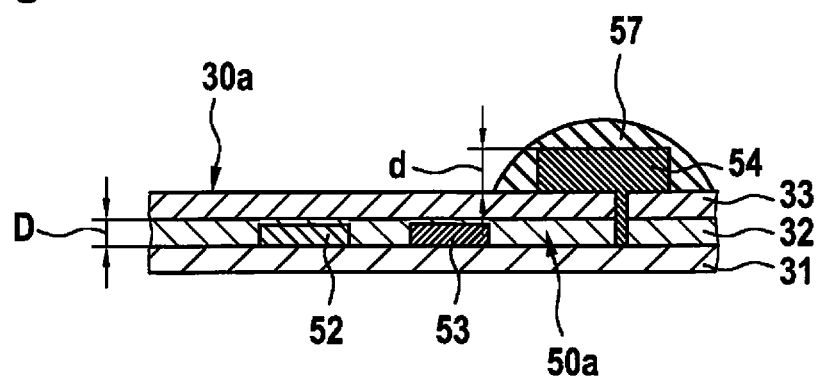
FIG. 4 shows a detail, which is modified with regard to FIG. 3, in which a component of an electronic circuit is situated on a top side of a layer.

FIG. 4 sectionally shows a carrier element 30a which is modified with regard to FIG. 3. At carrier element 30a, a component 54 of electronic circuit 50a is situated or fastened on the top side of layer 33 as a result of its thickness d which is greater than thickness D of (central) layer 32. Component 54 is encapsulated with the aid of a medium, for example an elastomer 57, elastomer 57 having electrically insulating properties.

Figure 5:
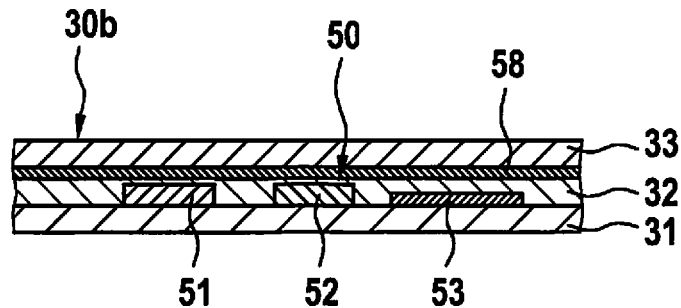
FIG. 5 shows a detail which is modified with regard to FIG. 3 using a metallic shielding layer.

In FIG. 5, a once again modified carrier element 30b is sectionally illustrated which differs from carrier element 30 according to FIG. 3 in that a layer 58 which is made of metal and which covers electronic circuit 50 or its components 51 through 53 on the side facing away from layer 31, is situated between the two layers 32 and 33, layer 58 being used as a shielding foil for improving the electromagnetic properties of electronic circuit 50. Layer 58 or foil is in particular manufactured using copper, aluminum, or iron and laminated into carrier element 30b.

Figure 6:
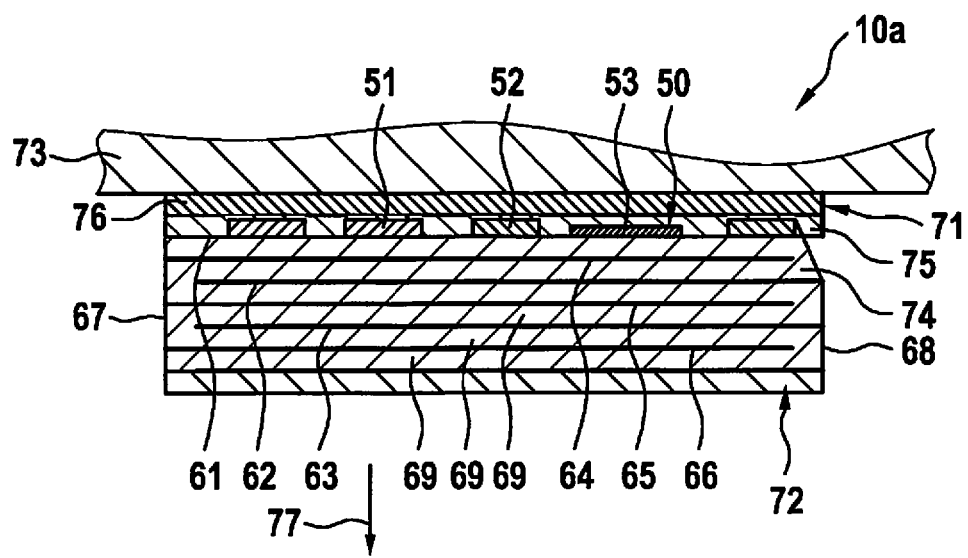
FIG. 6 shows a transducer device in the form of a stack actuator in a simplified longitudinal section.

Transducer device 10a illustrated in FIG. 6 includes a plurality of electrode layers 61 through 63 as well as 64 through 66 which are stacked on top of one another and connected to the different poles of output voltage $U_A$ of electronic circuit 50. Individual electrode layers 61 through 63 or 64 through 66 are each electrically conductively connected to a shared lateral contact 67, 68. Elastic intermediate layers 69 are moreover situated between individual electrode layers 61 through 66. The two outer electrode layers 61 and 66 are each connected to an end cap 71, 72, the one end cap 71 being connected by way of example to a carrier structure 73 and the other end cap 72 being connected to an element to be adjusted (not illustrated). Moreover, electronic circuit 50 is situated or accommodated in the area of the one end cap 71. For this purpose, end cap 71 includes similarly to carrier elements 30, 30a, 30b several layers 74 through 76 which are connected to one another, components 51 through 53 of electronic circuit 50 being situated or accommodated in central layer 75 by way of example, and electronic circuit 50 being connected to electrode layers 61 through 66 via lateral contacts 67, 68.

During an activation of electrode layers 61 through 66, the one end cap 72, which is connected to the element to be adjusted, is moved from the position shown in FIG. 6 into the direction of arrow 77.

Transducer devices 10, 10a described so far may be changed or modified in various ways, without departing from the inventive idea.

What is claimed is:

1. A transducer device, comprising:
   an electroactive polymer transducer, which has electrode layers which are situated in parallel to one another and which are connected to one another by inserting an elastic intermediate layer between the electrode layers;
   a carrier element to which edge areas of the electroactive polymer transducer are fastened, the carrier element including a plurality of electrically insulating layers; and
   a circuit having electronic components configured to generate an electrical voltage and to apply the electrical voltage to connection areas of the electrode layers of the electroactive polymer transducer, the circuit increasing an input voltage of the circuit to an increased voltage which is increased with regard to the input voltage, the electrical voltage which the circuit applies to the connection areas of the electrode layers being the increased voltage;
   wherein the circuit is situated at least partially between at least two of the plurality of electrically insulating layers of the carrier element, and the circuit forms, together with the electroactive polymer transducer, a combined unit in which the connection areas of the electrode layers to which the electrical voltage of the circuit is applied are electrically insulated; and
   wherein the electrode layers and the elastic intermediate layer have an annular configuration, and in a central area of the electroactive polymer transducer circumferentially surrounded by the electrode layers and the elastic intermediate layer, a weight element is situated which orients the central area to be parallel to and at a distance from the carrier element.

2. The transducer device of claim 1, wherein the carrier element has a flexible configuration.

3. The transducer device of claim 1, wherein the electronic components of the circuit are accommodated at least partially in at least one recess of one of the electrically insulating layers, the one of the plurality of electrically insulating layers being covered on both sides by other layers of the plurality of electrically insulating layers.

4. The transducer device of claim 1, wherein at least one of the electronic components of the circuit is situated on and connected to an outer side of an outer one of the plurality of electrically insulating layers, and the at least one of the electronic components is enclosed at least partially by an element which has electrically insulating properties.

5. The transducer device of claim 1, wherein the electronic components of the circuit are covered at least partially by a metallic layer.

6. The transducer device of claim 1, wherein the plurality of electrically insulating layers: (i) include polyamide (PI), or polycarbonate (PC), or a polyester (PE)-based plastic, and/or (ii) are made of polyamide (PI), or polycarbonate (PC), or a polyester (PE)-based plastic.

7. The transducer device of claim 1, wherein the plurality of electrically insulating layers connected to one another though a laminating process.

8. The transducer device of claim 1, wherein the increased voltage is more than 50 V.

* * * * *